(12) United States Patent
Vanitegem et al.

(10) Patent No.: US 8,816,890 B1
(45) Date of Patent: *Aug. 26, 2014

(54) INTEGRATED CIRCUIT DEVICE WITH PROGRAMMABLE BLOCKS AND ANALOG CIRCUIT CONTROL

(71) Applicant: Cypress Semiconductor Corporation, San Jose, CA (US)

(72) Inventors: Jean-Paul Vanitegem, San Jose, CA (US); Haneef Mohammed, Beaverton, OR (US); Hans Klein, Pleasanton, CA (US); Harold M. Kutz, Edmonds, WA (US); Ata Khan, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/859,621

(22) Filed: Apr. 9, 2013

Related U.S. Application Data

(63) Continuation of application No. 13/630,876, filed on Sep. 28, 2012, now Pat. No. 8,416,113.

(60) Provisional application No. 61/621,139, filed on Apr. 6, 2012.

(51) Int. Cl.
*H03M 1/66* (2006.01)
*H01L 25/00* (2006.01)

(52) U.S. Cl.
CPC .................................... *H01L 25/00* (2013.01)
USPC .......................................... 341/144; 341/147

(58) Field of Classification Search
CPC ................... G06F 1/022; H03M 1/66
USPC .......................................... 341/144, 147, 155
See application file for complete search history.

(56) References Cited

U.S. PATENT DOCUMENTS

| | | | |
|---|---|---|---|
| 4,851,838 A | 7/1989 | Shier | |
| 5,051,799 A | 9/1991 | Paul et al. | |
| 5,200,751 A * | 4/1993 | Smith | 341/147 |
| 5,410,186 A * | 4/1995 | Bonaccio et al. | 307/29 |
| 5,570,090 A * | 10/1996 | Cummins | 341/144 |
| 6,329,936 B1 | 12/2001 | Timm | |
| 6,356,224 B1 * | 3/2002 | Wohlfarth | 341/147 |
| 7,265,694 B2 | 9/2007 | Guidry | |
| 7,265,708 B2 | 9/2007 | Mitra et al. | |
| 7,411,538 B1 | 8/2008 | Piasecki | |
| 7,916,051 B1 | 3/2011 | Sestok et al. | |
| 7,944,379 B2 | 5/2011 | Ohnhaeuser et al. | |
| 7,956,787 B2 | 6/2011 | Westwick et al. | |

(Continued)

OTHER PUBLICATIONS

Lattice Semiconductor, Power Manager II—POWR1220AT8, found on the Internet at http://www.latticesemi.com/products/powermanager/powermanagerii/powermanageriipowr1220at8.cfm.
Mouser Electronics, Texas Instruments TMS320C5535 Fixed-Point DSPs, found on the Internet at http://www.mouser.com/new/texasinstruments/ti-tms320c5535/.
USPTO Non-Final Rejection for U.S. Appl. No. 13/630,876, dated Dec. 12, 2012; 5 pages.

(Continued)

*Primary Examiner* — Brian Young (57) ABSTRACT

An integrated circuit device can include a plurality of analog blocks, including a plurality of programmable analog blocks configurable to provide different analog functions in response to configuration data, at least one programmable analog block including a programmable analog routing coupled to a plurality of external connections to the integrated circuit device; and a plurality of programmable digital blocks, at least one programmable digital block configurable into an analog block control circuit that configures the programmable analog routing.

28 Claims, 9 Drawing Sheets

(56) References Cited

U.S. PATENT DOCUMENTS

| | | | |
|---|---|---|---|
| 8,212,703 B2 * | 7/2012 | Katsis et al. | 341/144 |
| 8,416,113 B1 * | 4/2013 | Vanitegem et al. | 341/155 |
| 2011/0304489 A1 | 12/2011 | Christer et al. | |
| 2012/0001783 A1 | 1/2012 | Eklund et al. | |

OTHER PUBLICATIONS

USPTO Notice of Allowance for U.S. Appl. No. 13/630,876, dated Feb. 4, 2013; 5 pages.

Vibhute, Pavankumar, Hardware Multiplexing of SAR ADC—PSoC® 5, Cypress Semiconductor Corporation EP64560, Oct. 13, 2010.

* cited by examiner

INTEGRATED CIRCUIT DEVICE WITH PROGRAMMABLE BLOCKS AND ANALOG CIRCUIT CONTROL

This application is a continuation of U.S. application Ser. No. 13/630,876 filed Sep. 28, 2012, now U.S. Pat. No. 8,416,113 issued on Apr. 9, 2013, which claims priority to U.S. Provisional Patent Application No. 61/621,139, filed Apr. 6, 2012, all of which is incorporated by reference herein in their entirety.

TECHNICAL FIELD

The present disclosure relates generally to integrated circuit devices having programmable blocks, and more particularly to devices having fixed analog functions.

BACKGROUND

Conventional systems and integrated circuit devices can include a mix of analog functions and digital processing. In some systems-on-chip devices, a successive approximation register type digital-to-analog converter (SARDAC) can be included with a central processing unit (CPU). The CPU can configure the SARDAC and then receive conversion values from the SARDAC. If needed, the CPU can re-configure the SARDAC as needed.

Such conventional devices can have limits in performance, particularly in cases where a high sample frequency is required. In such applications, SARDAC control can consume a large amount of CPU resources. Consequently, the ability of the CPU to perform other tasks is reduced, the response latency can increase, and power consumption can be high. At high enough frequencies, a CPU load can be so high that it can no longer complete primary tasks. In addition, configuring a device to respond to such high frequencies can require a more complex configuration/operating code (i.e., firmware), requiring additional memory resources.

DETAILED DESCRIPTION

Various embodiments will now be described that show integrated circuit devices, systems and methods having a processor and one or more analog blocks with a fixed function analog circuit. The fixed function analog circuit can be configured and/or controlled independently of the processor with a dedicated sequencer circuit and/or with programmable digital circuit blocks. Accordingly, the fixed function analog circuit can be operated without consuming processor resources.

In the embodiments below, like items are referred to by the same reference characters but with the leading digit(s) corresponding to the figure number.

Figure 1:
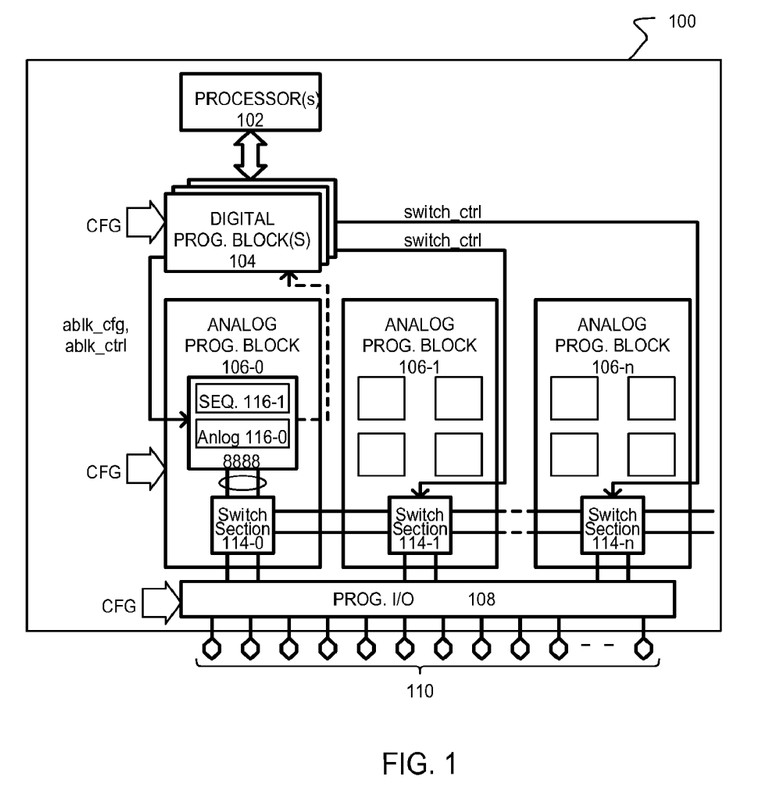
FIG. 1 is a block schematic diagram of an integrated circuit (IC) device according to an embodiment.

FIG. 1 is a block schematic diagram of an integrated circuit device 100 according to one embodiment. An integrated circuit device 100 can include a processor section 102, one or more programmable digital blocks (hereinafter "digital blocks") 104, programmable analog blocks (hereinafter "analog blocks") 106-0 to -n, a programmable input/output (I/O) fabric 108, and a number of external connections 110 to the IC device 100.

A processor section 102 can include one or more central processing units (CPUs) that can execute stored instructions. A processor section 102 can include suitable processor resources, including but not limited to, nonvolatile memory, volatile memory, interrupt control, clock sources, and power control circuits. In the embodiment shown, a processor section 102 can communicate with digital blocks 104 via a bus 112. In some embodiments, a processor section 102 can have some signal paths to analog blocks (106-0 to -n), such as interrupts, and the like. Such signal paths can be via programmable signal paths or dedicated signal paths.

Analog blocks (106-0 to -n) can be programmable via configuration data (CFG) to provide various analog circuit functions. One or more of analog blocks (106-0 to -n) can include a fixed-function analog circuit that performs a predetermined analog circuit function. Such fixed-function analog circuits can include, but are not limited to, data converters, including analog-to-digital converters (ADCs) and digital-to-analog converters (DACs), comparators, operational amplifiers, analog reference circuits (e.g., generators of analog reference voltages/currents), capacitance sensing circuits, display driving circuits (e.g., LCD drivers), charge pump circuits, analog filters, and temperature sensing circuits. It is understood that a fixed-function analog circuit can have different configurations and/or operating modes that can be set/controlled via digital values.

In the embodiment shown, each analog block (106-0 to -n) can have a programmable switching section (hereinafter "switching section") (114-0 to -n). Each switching section (114-0 to -n) can enable the creation of any of various programmable signal paths between the analog blocks (106-0 to -n) themselves and/or between the analog blocks (106-0 to -n) and the programmable I/O fabric 108. It is understood that the creation of such analog signal paths can be static (e.g., via configuration data CFG) or dynamic. In the particular embodiment shown, analog signal paths can be controlled via digital blocks 104.

Such an arrangement can enable the expansion of the number of inputs to be switched into an analog circuit 116. Such expansion can be static (established by configuration data CFG) and/or dynamic (e.g., via programmable digital blocks 104). Accordingly, routing of signals to analog blocks can be flexible and expandable.

In FIG. 1, analog block 106-0 is shown to include a fixed-function analog circuit (hereinafter "analog circuit") 116. Analog circuit 116 can include an analog section 116-0 and a sequencer section 116-1. An analog section 116-0 can include analog circuitry for executing one or more analog functions. A sequencer section 116-1 can automatically configure and control the analog section 116-0. Accordingly, predetermined analog functions can be executed without the need for substantial (or any) resources of processor section 102.

In particular embodiments, a sequencer section 116-1 can also process data values generated by analog circuit 116. Processed data (data_out) can be provided to digital blocks 104 and/or processor section 102. This can further free resources of processor section 102 to execute other tasks.

Referring still to FIG. 1, in the embodiment shown, an analog circuit 116 can also be controlled by one or more digital blocks 104. That is, digital blocks 104 can have signal paths (direct and/or via a switching fabric) to analog circuit 116, and can be configured into circuits that can control analog circuit 116. In FIG. 1, this is shown by signals ablk_cfg and ablk_ctrl output from digital blocks 104 to analog circuit 116. Accordingly, digital blocks 104 can supplement the configuration/control provided by sequencer section 116-1 or can completely replace sequencer section 116-1.

Still further, digital blocks 104 can be configured to provide additional processing of data generated by analog circuit 116. Accordingly, as needed, digital blocks 104 can take on processing tasks to free up resources of processor section 102. Thus, for a given application, a trade-off can be made between resources of processor section 102 and digital section 104 to achieve a desired performance (e.g., speed of processing, power consumption, etc.).

A programmable I/O fabric 108 can enable various analog signal paths between external connections 110 of the IC device 100 and the analog blocks (106-0 to -n). In the embodiment shown, paths can be established with configuration data (CFG). However, in other embodiments, all or portions of such analog signal paths to analog blocks (106-0 to -n) can be dynamically controlled (e.g., via digital blocks 104). External connections 110 can be any suitable physical connect to an integrated circuit device, including but not limited to: pins, pads, bumps, etc.

It is noted that in some embodiments, a programmable I/O fabric (not shown) can connect external connections to digital blocks 104.

In some embodiments, the various sections of the IC device 100 shown in FIG. 1 can be formed in a same integrated circuit substrate. That is, IC device 100 can be a monolithic IC device. However, in alternate embodiments, an IC device 100 can be a single integrated circuit package, with multiple ICs interconnected to one another (e.g., a multi-chip module). In still other embodiments, a processor section 102 can be separate from an integrated circuit device that includes the programmable analog and digital blocks.

Figure 2:
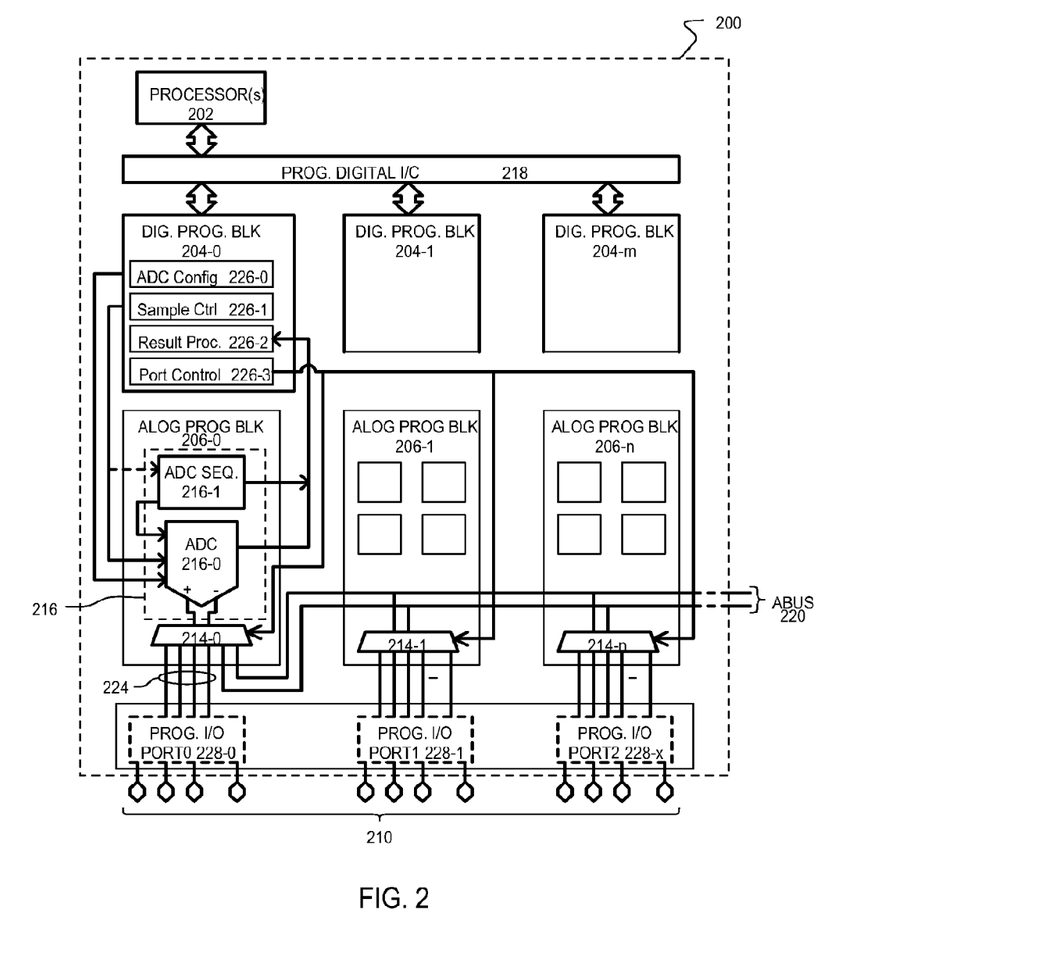
FIG. 2 is a block schematic diagram of an IC device according to an embodiment having an analog-to-digital converter (ADC) as a fixed-function analog circuit

FIG. 2 is a block schematic diagram of an IC device 200 according to another embodiment in which a fixed-function analog circuit can be an ADC. Sections of IC device 200 like those of FIG. 1 can have like functions, and be subject to the same variations as noted in conjunction with FIG. 1.

FIG. 2 differs from FIG. 1 in that it shows a programmable digital interconnect (I/O) 218. Digital I/C 218 can provide programmable signal paths between programmable digital blocks (204-0 to -m) themselves and between such blocks and processor section 202.

Further, digital block 204-0 is shown to be configured into an ADC control circuit, and includes an ADC configuration section 226-0, a sample control section 226-1, a result processing section 226-2, and a port control section 226-3. An ADC configuration section 226-0 can apply configuration values to an ADC 216-0. Such configuration values can establish operations of ADC 216-0 and can include, but are not limited to: resolution, range (range of voltages that can be converted), conversion speed/accuracy, to name but a few. A sample control section 226-1 can control sample operations, including but not limited to: sample rate and sample duration. A result processing section 226-2 can execute predetermined arithmetic/logic operations on sample data output from ADC 216-0. Such operations can enable processing of sample data independent of processor section 202. Processed sample data can then be provided to processor section 202.

A port control section 226-3 can control switching of signal paths into ADC 216-0. As shown, a port control section 226-3 can control signal paths of switching sections (214-1 to -n) of other analog blocks (206-1 to -n) to enable various combinations of physical inputs (ports) to be switched as inputs to ADC 216-0. As will be described in more detail below, such a capability can enable a number of ports to ADC 216-0 to be expanded beyond those accessed via ADC sequencer section 216-1. Further, such a capability can enable essentially arbitrary selection of inputs to ADC. This is in contrast to conventional devices that may restrict analog conversion inputs to adjacent pins.

In some embodiments, signals between ADC 216-0 and digital section 204-0 can be independent of ADC sequencer section 216-1. However, in other embodiments, such signal paths can pass through ADC sequencer section 216-1.

It is understood that while FIG. 2 shows one digital block 204-0 programmed into an ADC control circuit, such a control circuit can be scaled up by incorporating more digital blocks (i.e., 204-1 to -m), as such digital blocks can be interconnected via programmable digital I/C 218. That is, more complex control of ADC 216-0 and more sophisticated processing of ADC data can be scaled up as needed by using additional digital blocks (204-0 to 204-n).

Analog block 206-0 can include fixed function ADC circuit 216 and ADC MUX 214-0. ADC circuit 216 can include an ADC sequencer section 216-1 and ADC 216-0. An ADC sequencer section 216-1 can configure and control ADC 216-0 independently of control by a digital block (i.e., 204-0). In the particular embodiment shown, and ADC MUX 214-0 can have dedicated inputs 224, but can also have inputs from other analog blocks.

An ADC circuit 216 can include any suitable ADC circuit, but in particular embodiments, can be a successive approximation register type ADC (SARADC). In alternate embodiments, an ADC circuit 216 can take other forms, including but not limited to an integrating-type ADC or resistive ladder (flash) type ADC. In the latter cases, the ADC circuit can be connected to external circuit component (e.g., capacitors, resistors).

In a particular embodiment, an ADC sequencer section 216-1 can control switching of ADC MUX 214-0 to switch inputs into ADC 216-0. However, utilizing only ADC MUX 214-0 can limit the number/combinations of inputs possible. Inclusion of a port control section (e.g., 226-3) can greatly expand the number of inputs and input options possible, as compared to the number of ports controlled by the ADC sequencer section 216-1 alone.

Referring still to FIG. 2, in the particular embodiment shown, an analog bus 220 can interconnect the various analog blocks (206-0 to -n) to one another. Further, analog bus 220 can be an input to ADC MUX 214-0. Accordingly, various inputs to some analog blocks (i.e., 206-1 to -n) can be connected to analog circuits in other blocks (i.e., 206-0).

In FIG. 2, programmable I/O fabric 208 is shown programmed, by configuration data, into port groups 228-0 to -x. Each port group (228-0 to -x) can connect a set of physical connections 210 to an analog block (206-0 to -n). In some embodiments, such connections can be static, being established by configuration data. However, in other embodiments, such connections can be dynamic, being controlled by other circuits sections of the IC device (e.g., digital blocks 204-0 to -m). By routing connections to various ports through other analog blocks (206-1 to -n), ports accessible by ADC 216-0 can be expanded as desired.

Figure 3:
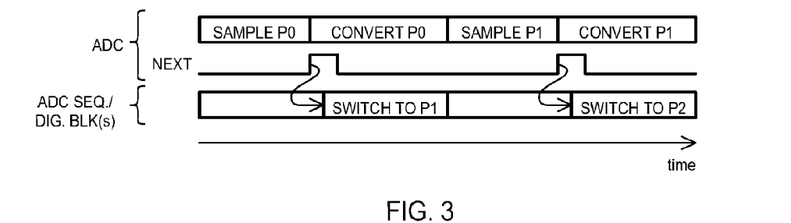
FIG. 3 is a timing diagram showing sample operations according to an embodiment.

FIG. 3 is a timing diagram showing ADC operations according to an embodiment. FIG. 3 shows actions executed by an ADC (shown as ADC) and actions executed by an ADC controller independent of a processor section, such as those performed by an ADC sequencer section and/or a digital block programmed to be an ADC controller (shown as ADC SEQ./DIG. BLK(s)).

An ADC can sample a port (SAMPLE P0). After the sampling of a port is complete, the ADC can activate a next indication (NEXT) and start converting the sampled analog value into a digital value (CONVERT P0). During this time, in response to the active next indication, an ADC controller (independent of any processor control), can switch to a next port in a designated sequence (SWITCH TO P1).

Once conversion of the sample is complete, ADC can sample the next port, and the operations can continue in the same fashion, switching to a next port while a previous port value is converted.

It is understood that while FIG. 3 shows conversions for an IC device that includes one ADC, in other embodiments multiple ADCs can be included, enabling even faster switching between ports.

In addition or alternatively, while FIG. 3 shows operations for an ADC, the same operations can be applied to other fixed function analog circuits.

Figure 4A:
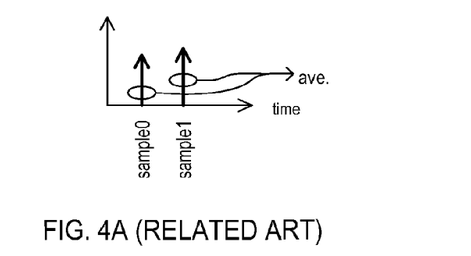
FIG. 4A is a timing diagram of a conventional ADC sampling process.

FIG. 4A is a timing diagram showing a conventional sample averaging operation. In some conventional systems with ADC circuits, an ADC can be capable of averaging consecutive samples. In FIG. 4A, the conventional ADC makes a first sample (sample0) immediately followed by a second (sample1). Such adjacent sample values can then be averaged to generate an average sample value.

Figure 4B:
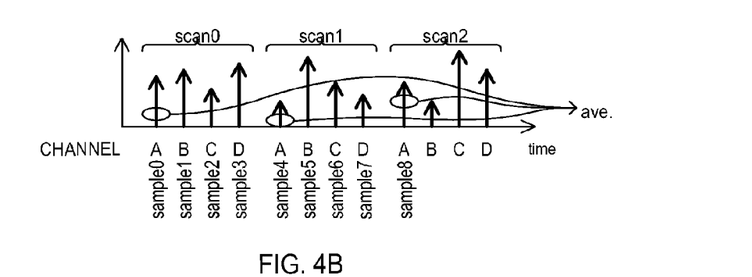
FIG. 4B is a timing diagram of a sampling process of an ADC according to an embodiment.

FIG. 4B is a timing diagram showing a sample averaging operation according to an embodiment. In the embodiment shown, an ADC can be controlled to sequentially sample different channels (e.g., ports A, B, C, D) in repeated scan operations (scan 0, scan 1, scan 2, scan 3). A sequencer circuit (or programmed digital block) can assign samples results to channels and scans, and then average the same channel over multiple scans. Thus, as shown in FIG. 4B, samples 0, 4 and 8, corresponding to channel A can be averaged. It is understood any of various sample groupings/processing can be accomplished with a sequencer circuit or one or more digital blocks programmed to operate as an ADC controller and/or ADC data processor. This is in sharp contrast to the limited conventional feature shown in FIG. 4A.

As noted above, inclusion of a sequencer section and/or digital blocks programmed as controllers can enable dynamic control of a fixed-function analog circuit. In particular embodiments, operation of a fixed-function analog circuit can be altered in response to outputs from such a circuit. Again, such actions can be independent of processor control. An example of one such operation is shown in FIG. 5.

Figure 5:
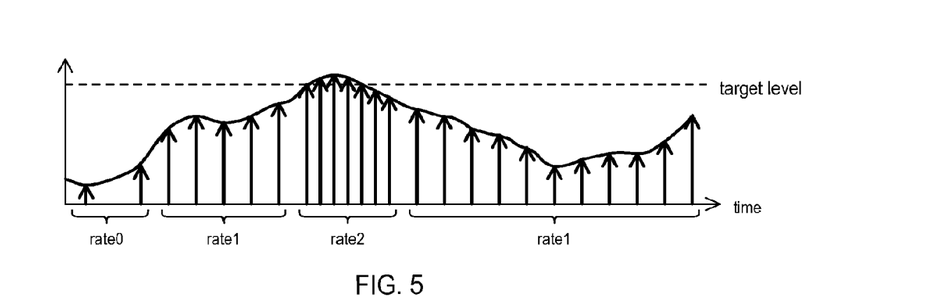
FIG. 5 is a timing diagram of an ADC sampling operation according to an embodiment.

FIG. 5 is a timing diagram showing sample operations of an ADC. In particular, an ADC can increase a sampling rate as a sampled value approaches a target level. Accordingly, when initial sampled values are far from a targeted level, sample can occur at a first rate (rate0).

As sampled values get within a certain range of a target level, a sample rate can increase (rate1). Such an action can include an ADC controller receiving sampled values from the ADC, and in response, generating new control values which increase the sampling rate of the ADC. Such an ADC controller can include an ADC sequencer section, one or more programmed digital blocks, or combinations thereof.

When the sampled values are close the target level, the ADC can switch to a fast sample rate (rate2). As sampled values diverge away from the target level, a sample rate can slow (return to rate1 in FIG. 5).

Figure 6:
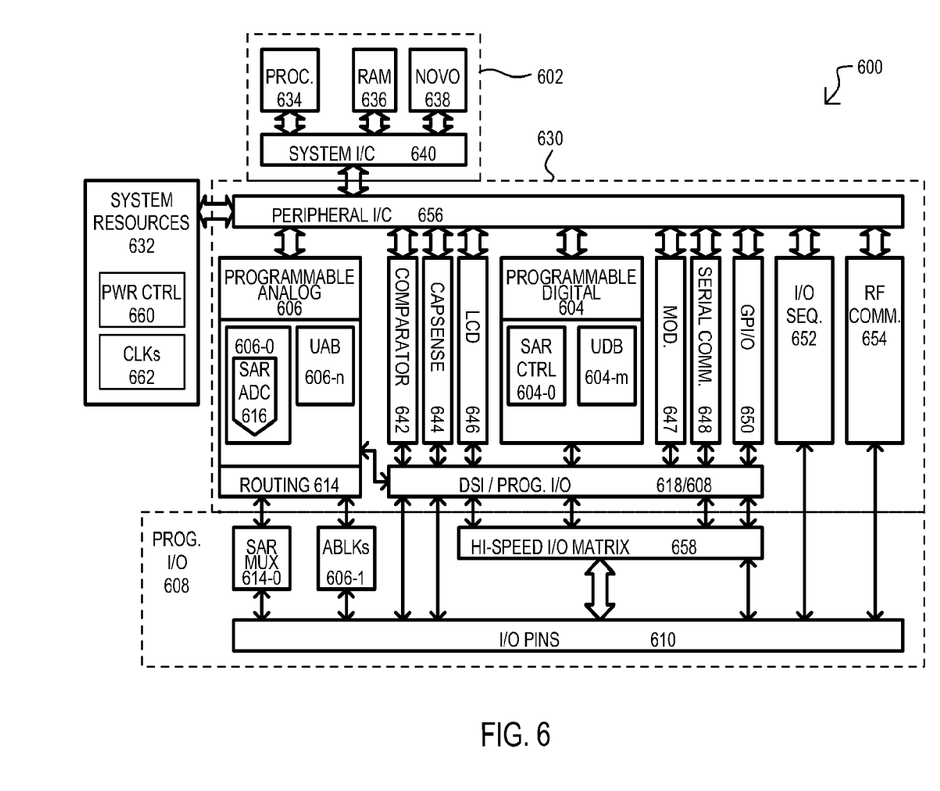
FIG. 6 is a block schematic diagram of a system-on-chip IC device according to an embodiment.

FIG. 6 is a block schematic diagram of an IC device 600 according to a further embodiment. An IC device 600 can be a programmable system-on-chip (SoC) having a central processing unit (CPU), programmable digital blocks, programmable analog block, and programmable interconnects between the various sections and I/O pins. In the embodiment shown, an IC device 600 can include a processor section 602, a programmable section 630, a programmable I/O fabric 608, and system resources 632.

A processor section 602 can include a CPU 634, random access memory (RAM) 636, and nonvolatile memory 638 interconnected to one another via a system interconnect 640. A nonvolatile memory 638 can store instructions for execution by CPU 634 as well as configuration information for programming programmable section 630.

A programmable section 630 can include various programmable circuits and interconnects, including programmable analog blocks (which can include fixed function analog circuits), programmable digital blocks, and other fixed function circuits. In the embodiment shown, programmable section 630 can include an analog section 606, a digital section 604, a comparator section 642, a capacitance sense section 644, a liquid crystal display (LCD) driver section 646, a modulator section 648, a serial communications section 650, a general purpose I/O (GPIO) path 652, an I/O sequencer section 654, an RF communication section 654, and a digital system interconnect (DSI) 618 and programmable I/O 608.

An analog section 606 can include programmable analog blocks (606-0, 606-1, 606-n), which can take form of any of those shown herein, or equivalents. Analog block 606-0 can be a SARADC block, and can include a fixed-function SARADC 616, which can include an ADC sequencer section and SARADC section as described herein, or equivalents. Further, a SARMUX 614-0 can provide switchable inputs to the SARADC. In one very particular embodiment, analog block 606-1 can be a continuous time block that includes operational amplifiers (op amps) and corresponding comparator circuits. Analog section 606 can also include analog routing 614 which can enable additional routing of analog signals between analog blocks (606-0 to -n).

A digital section 604 can include programmable digital blocks (604-0 to -m), which can take the form of any of those described herein, or equivalents. In the embodiment shown, digital block 604-0 is programmed into an SARADC controller.

A comparator section 642 can be another analog block that provides analog comparators. A capacitance sense (capsense) section 642 can include capacitance sensing circuits for sensing capacitance on I/O pins (i.e., for touch sense applications and the like). An LCD driver section 646 can generate signals for controlling an LCD display. A modulation section 647 can provide any of various modulation functions. As but one example, a modulation section 647 can perform pulse width modulation.

A serial communication section 648 can provide serialization, de-serialization, encoding and decoding according to one or more serial communication standards. In particular embodiments, serial communications sections 648 can enable communications according to any of the following standards: a controller area network (CAN), $I^2C$, universal serial bus (USB), and/or IEEE 1394.

A GPIO path 650 can enable external connections (I/O pins) 610 to serve as digital or analog inputs, for greater flexibility in routing of signals.

An I/O sequencer 652 can provide for a sequential connection of a group of external connections 610 to analog blocks within IC device 600. For example, an I/O sequencer 652 can enable the automatic scanning of a capacitance sense array.

An RF communication section 654 can include radio communication circuits to enable radio communication with other devices.

A peripheral interconnect fabric 656 can enable all of the various portions of programmable section 630 to communicate with one another. In addition, a digital system interconnect (DSI) 618 and programmable I/O fabric 608 can enable some of the portions of programmable section 630 to communicate with one another.

A programmable I/O fabric 608 can also enable programmable interconnections between external connections 610 and various circuits as shown. In the embodiment shown, a programmable I/O fabric 608 can include a high speed matrix 658 which can enable high speed communications between an external connection and other circuits within the IC device 600.

System resources 632 can include power control circuits 660 and clock circuits 662. Power control circuits 660 can selectively place different portions of the IC device into lower power consumption modes. In some embodiments, power control circuits 660 can place a processor section 202 into a lower power (e.g., sleep) mode while analog block 206-0 can generate data. Once such data is ready, the processor section 202 can switch to a higher power mode. Clock circuits 662 can generate timing signals for use by the IC device 600.

In one embodiment, an IC device 600 can have two modes of operation. In a first mode of operation, an SARADC circuit 616 can operate according to an ADC sequencer independent of CPU 634. In such a mode, according to a configuration of programmable I/O fabric 606, external connections 610 can be connected to inputs of ADC circuit 616 through SARMUX 614-0 by operation of an ADC sequencer (not shown, but part of SARADC circuit 616). An ADC sequencer can also process sampled results.

In a second mode of operation, an SARADC circuit 616 can operate according to digital block 604-0. Further, external connections 610 can be connected to inputs of ADC circuit 616 through both SARMUX 614-0 and other analog blocks (e.g., 606-1). Accordingly, a greater number and/or different combination of inputs can be connected to SARADC circuit 616. Still further, digital block 604-0 can process results from SARADC circuit 616 to a greater extent that an ADC sequencer alone.

As noted above, in alternate embodiments, operations of SARADC 616 can be controlled by both an ADC sequencer and a programmed digital block.

In one very particular embodiment, an IC device 600 can be from the PsoC® family of programmable embedded system-on-chip devices, manufactured by Cypress Semiconductor Corporation of San Jose, Calif., U.S.A.

Figure 7:
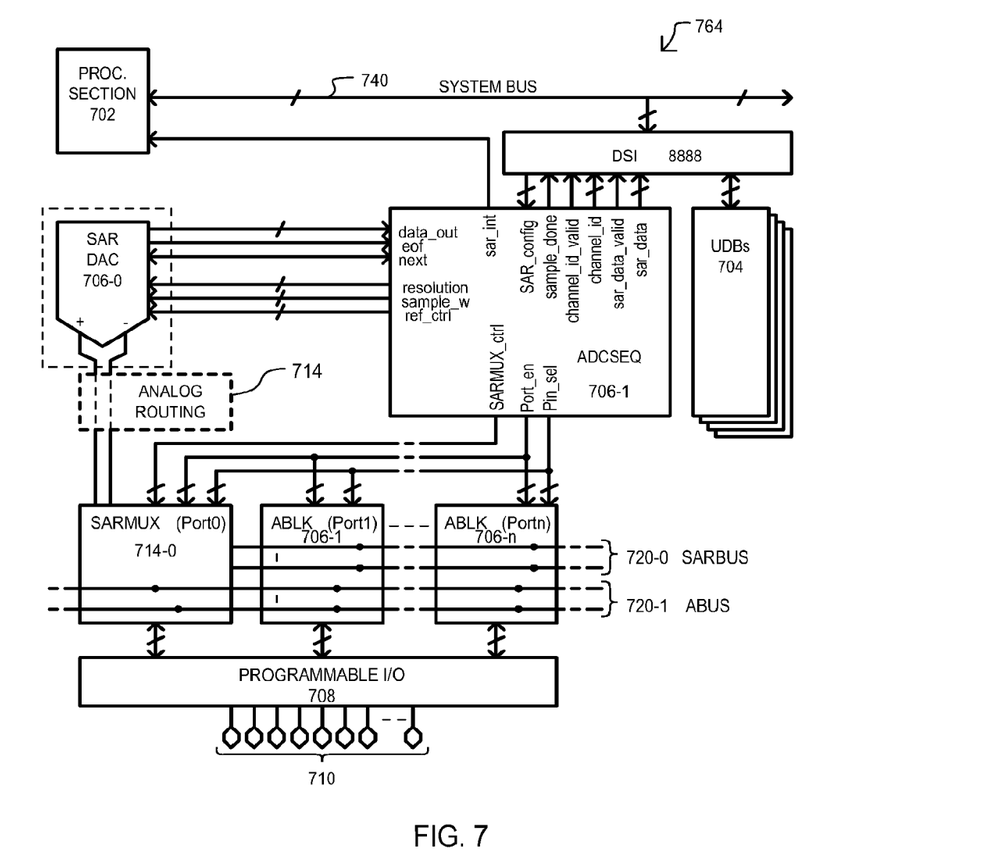
FIG. 7 is a block schematic diagram of successive approximation register type (SAR) ADC circuits according to embodiments.

FIG. 7 is a block schematic diagram of SARADC circuits 764 according to one particular embodiment. FIG. 7 can be one particular implementation SARADC circuits shown in FIG. 6, and corresponding sections are referred to by the same reference character but with the leading digit being "7".

SARADC circuits 764 can include a processor section 702, digital system interconnect (DSI) 718, programmable digital blocks 704, an ADC sequencer 706-1, an SARADC 706-0, a SARMUX 714-0, analog blocks (706-1 to -n), programmable I/O fabric 708, and external connections (e.g., pins 710). A processor section 702 can be connected to DSI 718 via a system bus 740.

In the embodiment shown, an ADC sequencer 706-1 can receive SARADC configuration data (SAR_config) from DSI 718. Such configuration data can originate from processor section 702 or digital blocks 704. When received from digital blocks 704, such configuration data can enable a SARADC to be re-configured independent of the processor section 702.

In the embodiment shown, an ADC sequencer 706-1 can output signals to DSI 718 including: sample_done, which can indicate a sampling operation is complete; channel_id_valid, which can indicate a channel id being transmitted is valid; channel_id, which can identify a channel for a sample; sar_data_valid, which can indicate data being transmitted is valid sample data; and sar_data, which can be sample data. Such output signals can be routed, via DSI 718, to digital blocks 704. A processor section 702 can access sample data from digital blocks 704 via system bus 740. Transmitting such values to digital blocks 704 can enable ADC sample results to be processed independent of the processor section 702. In alternate embodiments, a processor section 702 can access an ADC sequencer 706-1 independently of digital blocks 704. In some embodiments, an ADC sequencer can also control an input voltage range for an ADC circuit. That is, by operation of ADC sequencer 706-1 (or control of a digital block), and ADC can derive a value between two voltage levels (i.e., one input does not have to be at ground)

ADC sequencer 706-1 can output control signals to control the operation of SARADC 706-0. In the embodiment shown, ADC sequencer 706-1 can output signals to SARADC 706-0 that include: resolution, which can establish the bit-resolution of the SARADC 706-0; sample_w, which can establish a sample width; and ref ctrl, which can set reference voltages and/or currents within SARADC 706-0. In FIG. 7, ADC sequencer 706-1 can receive signals from SARADC 706-0, including data_out, which can be sample data; and next, which can indicate that a sample is complete (and can therefor trigger a channel change as shown in FIG. 3). Further, ADC sequencer 706-1 can provide one or more interrupts sar_int to processor section 702.

ADC sequencer 706-1 can also control the switching of ports to the SARADC 706-0. In the embodiment shown, ADC sequencer 706-1 can control SARMUX 714-0 with control signals SARMUX_ctrl. In addition, signals Port_en and Pin_sel can be output from ADC sequencer 706-1 to enable signals to be routed via other analog blocks (e.g., 706-1 to -n).

In the particular embodiment shown, a first analog bus SARBUS 720-0 can enable signals from other analog blocks (706-1 to -n) to be routed into SARMUX 714-0 (and hence to SARADC 706-0). In addition, a second analog bus ABUS 720-1 can enable signals to be routed between all analog blocks (706-0 to -n), including into SARMUX 714-0. Optionally, signals between SARMUX 714-0 and SARADC 706-0 can pass through another set of analog routing 740.

Programmable I/O fabric 708 can enable external connections 710 to be connected to various analog blocks (706-0 to -n), and thus serve as input ports to SARADC 706-0.

It is understood that any of the control signals output from ADC sequencer 706-1 can be generated by a state machine within ADC sequencer 706-1, or can be generated in response to controls signals from one or more digital block(s) 704.

Figure 8:
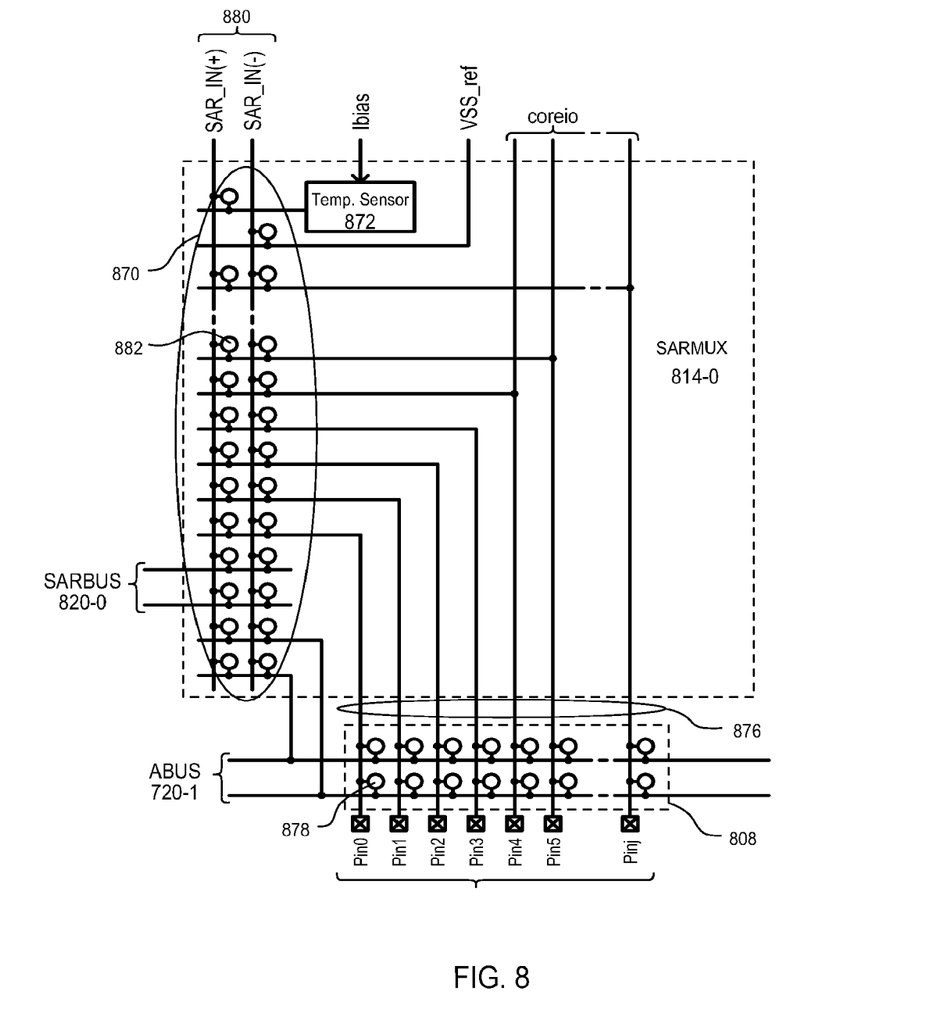
FIG. 8 is a block schematic diagram of an SAR multiplexer circuit that can be included in embodiments.

FIG. 8 is a block schematic diagram of a SARMUX circuit 814-0 and a portion of a programmable I/O fabric 808 that can be included in embodiments. FIG. 8 can be one particular implementation of the SARMUX shown as 714-0 in FIG. 7, and a portion of I/O fabric shown as 708 in FIG. 7.

FIG. 8 shows a portion of I/O fabric 808 which can selectively connect external connections (Pin0 to Pinj) 810 to lines of analog bus (ABUS) 820-1 by operation of switch elements (one shown as 878). In one very particular embodiment, a state of switch elements (e.g., 878) of I/O fabric portion 808 can be established via configuration information or signals from a DSI (not shown). External connections 810 can have direct connections to SARMUX I/Os 876

Within SARMUX 814, SARMUX I/Os 876 or lines of analog buses 820-0/1 can be connected to SARADC inputs 880 by switch fabric 870. Switch fabric 870 can include switch elements (one shown as 882). In one very particular embodiment, a state of some switch elements (e.g., 882) can be established via configuration information or signals from a DSI (not shown), while others of the switch elements (e.g., 882) can be further controlled by an ADC sequencer (not shown).

FIG. 8 also shows a temperature sensor circuit 872 that can be connected to either of SARADC inputs 808, and a reference VSS that can be connected to a (−) input of SARADC.

In this way, various buses and pins can be dynamically connected to inputs 880 of a SARADC via any of: an ADC sequencer; signals from a DSI generated from digital block(s); or configuration data. The former can enable dynamic control of such switching.

Figure 9:
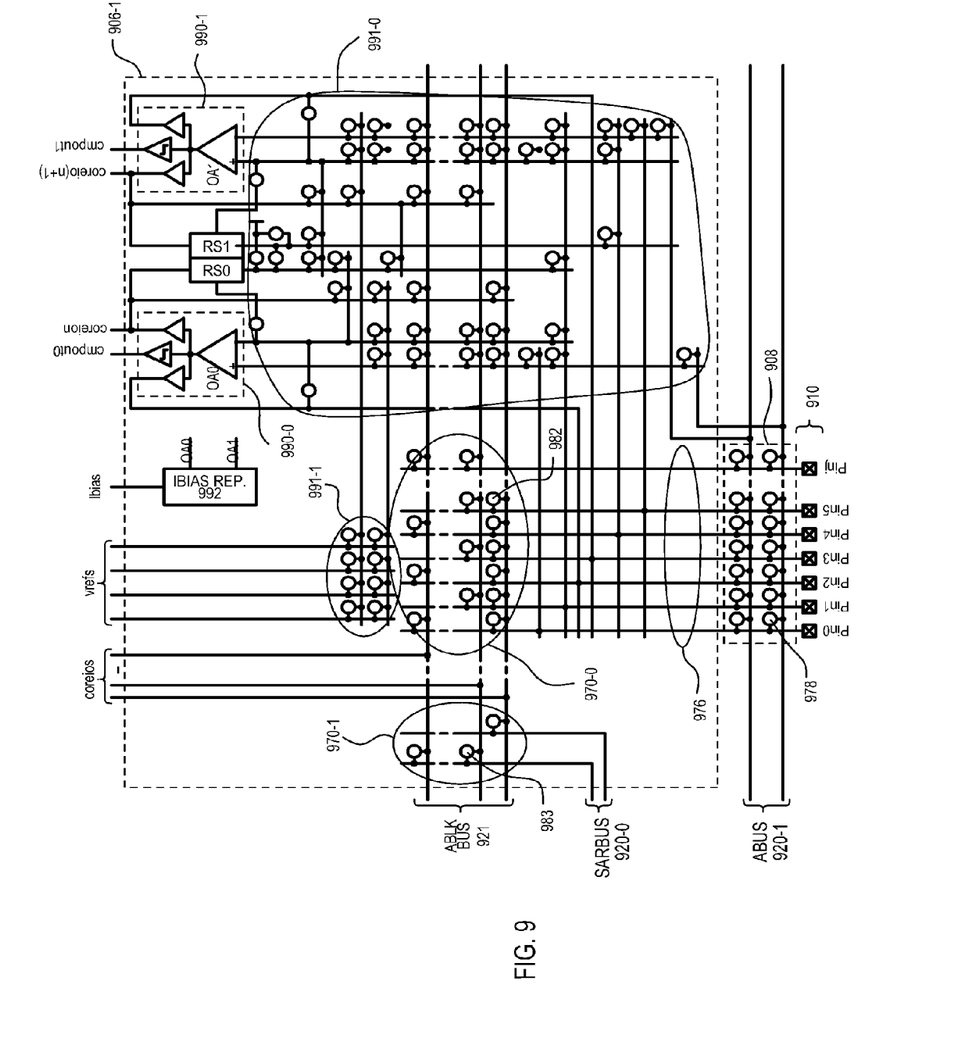
FIG. 9 is a block schematic diagram of a programmable analog block that can be included in embodiments.

FIG. 9 is a block schematic diagram of an analog block 906-1 and a portion of programmable I/O fabric 908 that can be included in embodiments. FIG. 9 can be one particular implementation of the analog block shown as 706-1 in FIG. 7, and a portion of I/O fabric shown as 708 in FIG. 7.

FIG. 9 shows a portion of I/O fabric 908 which can selectively connect external connections (Pin0 to Pinj) 910 to lines of analog bus (ABUS) 920-1 by operation of switch elements (one shown as 978). In one very particular embodiment, a state of switch elements (e.g., 978) of I/O fabric portion 908 can be established via configuration information or signals from a DSI (not shown). External connection 910 can also be directly connected to block I/Os 976.

Within analog block 906-1, block I/Os 976 can be connected to a block bus 921 by switch fabric 970-0. Switch fabric 970-0 can include switch elements (one shown as 982). In one very particular embodiment, a state of some switch elements (e.g., 982) can be established via configuration information or signals from a DSI (not shown), while others of the switch elements (e.g., 982) can be further controlled by an ADC sequencer (not shown).

Also within analog block 906-1, lines of block bus 921 can be connected to analog bus (SARBUS) 920-0 by switch fabric 970-1. Switch fabric 970-1 can include switch elements (one shown as 983) having states established via configuration information, signals from a DSI (not shown), or signals from an ADC sequencer (not shown).

In the particular embodiment of FIG. 9, analog block 906 can also include operational amplifier (op amp) circuits 990-0/1 that can be connected to block bus 921 via switch fabric 991-0 and to reference voltages inputs via switch fabric 991-1. Also shown is a bias current replicator circuit 992 which can provide bias currents to the op amp circuits 990-0/1. However, it is understood that analog blocks having other function types (i.e., not op amp blocks) could include similar programmable routing to enable the expansion of inputs to some fixed function analog circuit (e.g., an SARADC).

In this way, various buses and pins can be dynamically connected to inputs of a SARADC via a switching fabric of other analog blocks, by signals from any of: an ADC sequencer; a DSI (generated from digital block(s)); or configuration data. The former can enable dynamic control of such switching.

Figure 10:
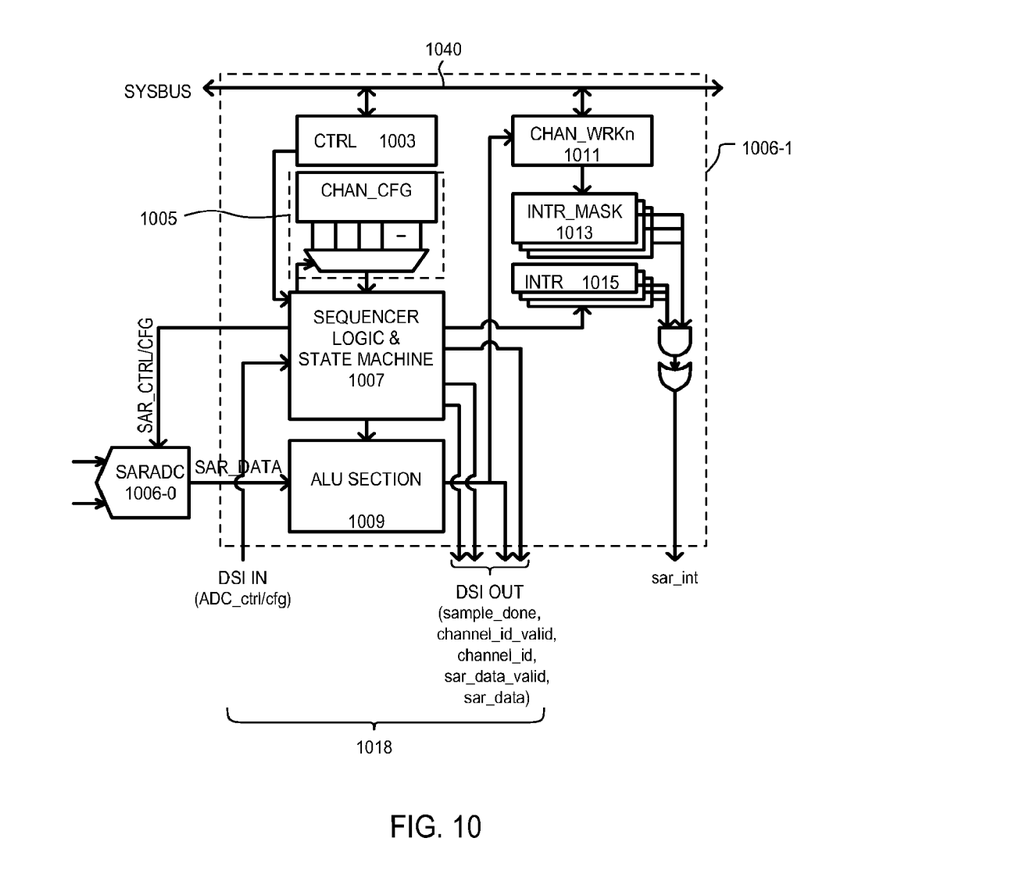
FIG. 10 is a block schematic diagram of an ADC sequencer according to one particular embodiment.

FIG. 10 is a block schematic diagram showing an SARADC 1006-0 and an ADC sequencer 1006-0 that can be included in embodiments. FIG. 10 can be one particular implementation of the SARADC and ADC sequencer shown as 706-0/1 in FIG. 7.

An ADC sequencer 1006-1 can include a control section 1003, a channel configuration section 1005, sequencer logic and state machine (sequencer logic) 1007, an arithmetic/logic (ALU) section 1009, a channel work section 1011, an interrupt mask 1013, and an interrupt generator 1015.

A control section 1003 can receive values for controlling the operation of sequencer logic 1007, and thereby the operation of ADC sequencer 1006-1. In one embodiment, according to configuration data, control values output from sequencer logic 1007 can be generated by the sequencer logic 1007, or can be generated from signals received over DSI 1018. A channel configuration section 1005 can provide configuration data for each channel scanned by SARADC 1006-0. Thus, sample values can be assigned to channels and/or channels can be processed differently from each other.

Sequencer logic 1007 can control the operation of SARADC 1006-0 according to its own circuits, or according to signals received over DSI 1018 (which can be generated from a programmable digital block). Such signals are shown as ADC_Ctrl/Cfg. In the embodiment shown, sequencer logic 1007 can control and configure SARDAC 1006-0 with control values SAR_CTRL/CFG. Sequencer logic 1007 can also output indications onto DSI to enable sampling operations to be monitored and/or sample results received by other portions of a device. In the particular embodiment shown, such values can include those described in FIG. 7 (i.e., sample_done, channel_id_valid, channel_id, sar_data valid).

An ALU section 1009 can receive sample data (SAR_DATA) from SARADC 1006-0, and can perform arithmetic and/or logic operations on such data. Such operations can be performed according to control data output from sequencer logic 1007. Arithmetic/logic operations can include, but are not limited to: accumulation of values, averaging of values, applying signs to values, extending a size of values, or shifting of values. Of course, an ALU section 1009, according to outputs from sequencer logic 1007, can perform no operations on sample data. Processed (or not processed) sample data output from ALU section 1009 can be provided to DSI 1018 (sar_data) and to channel work section 1011.

A channel work section 1011 can output (processed) sample values on a system bus 1040 for access by a processor section or the like. In addition, a channel work section 1011 can receive interrupt mask data over the system bus 1040. Interrupt generator 1015 can generate interrupts according to states of sequencer logic 1007. Accordingly to interrupt mask 1013, an interrupt can be activated (sar_int).

The embodiments above have shown devices and corresponding operation methods. Additional method embodiments will now be described with reference to flow diagrams.

Figure 11:
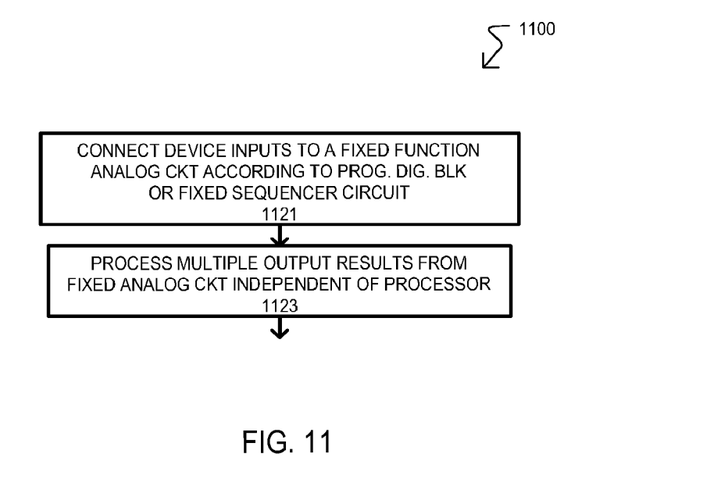
FIG. 11 is a flow diagram of a method according to an embodiment.

FIG. 11 is a flow diagram of a method 1100 according to one embodiment. A method 1100 can include connecting device inputs to a fixed function analog circuit according to a programmed digital block or a fixed sequencer circuit 1121. A programmed digital block and can be a programmable digital block programmed with configuration data to generate control signals that enable connections to device inputs. In a very particular embodiment, a fixed function analog circuit can be an ADC circuit.

Multiple output results from the fixed function analog circuit can be processed independently of a processor 1123. Such an action can include processing data with circuits different from a central processing unit included on the same device.

Figure 12:
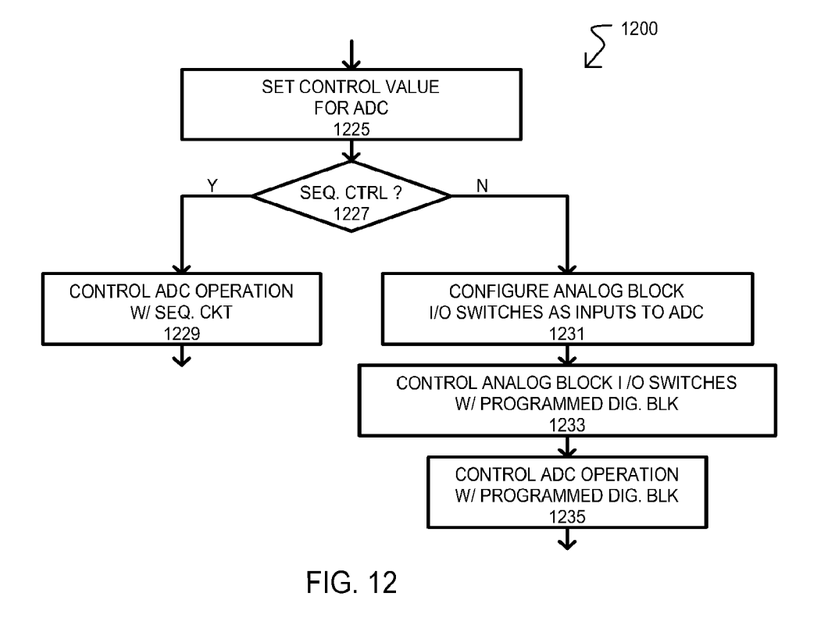
FIG. 12 is a flow diagram of a method according to another embodiment.

FIG. 12 is a flow diagram of a method 1200 according to another embodiment. A method 1200 can include setting a control value for an ADC 1225. Such an action can include programming a device with configuration data, or providing a predetermined input to a device. If the control value indicates sequencer control (Y from 1227), the operation of the ADC can be controlled with a sequencer circuit 1229.

However, if the control value does not indicate sequencer control (N from 1227), analog blocks I/O switches can be configured into inputs of the ADC 1231. Such an action can enable static and/or dynamic connections between an ADC and external connections to a device. A method 1200 can further include controlling analog block I/O switches with programmed digital blocks 1233. Operations of the ADC can be controlled with the programmed digital blocks 1235.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit device, comprising:
a plurality of analog blocks, including a plurality of programmable analog blocks configurable to provide different analog functions in response to configuration data, at least one programmable analog block including a programmable analog routing coupled to a plurality of external connections to the integrated circuit device;
a plurality of programmable digital blocks, at least one programmable digital block configurable into an analog block control circuit that configures the programmable analog routing; and
at least one processor circuit coupled to at least one programmable digital block, the processor circuit formed in the same substrate as the analog blocks and programmable digital blocks, wherein the analog block control circuit is configured to control at least the programmable analog routing independently of the processor circuit.

2. The integrated circuit device of claim 1, wherein:
the analog block control circuit is further configured to control analog circuit functions of the at least one programmable analog block.

3. The integrated circuit device of claim 1, wherein:
the programmable analog block includes an analog circuit selected from the group of: data converters, including analog-to-digital converters (ADCs) and digital-to-analog converters (DACs), comparators, operational amplifiers, analog reference circuits, capacitance sensing circuits, display driving circuits, charge pump circuits, analog filters, and temperature sensing circuits.

4. An integrated circuit device, comprising:
a plurality of programmable digital blocks;
a plurality of analog blocks, each comprising at least one analog circuit, the plurality of analog blocks including fixed function analog blocks and at least one analog block being a programmable analog block; and
a plurality of external connections,
wherein the programmable analog block includes a programmable switch section configurable to enable any of a plurality of signal paths to at least the external connections in response to inputs from at least one programmable digital block.

5. The integrated circuit device of claim 4, wherein:
at least one of the analog blocks includes an analog circuit selected from the group of: data converters, including analog-to-digital converters (ADCs) and digital-to-analog converters (DACs), comparators, operational amplifiers, analog reference circuits, capacitance sensing circuits, display driving circuits, charge pump circuits, analog filters, and temperature sensing circuits.

6. The integrated circuit device of claim 4, wherein:
the at least one programmable analog block is further configurable to provide different analog functions in response to configuration data.

7. The integrated circuit device of claim 4, wherein:
at least one of the digital blocks is configurable to process data from at least one analog block.

8. The integrated circuit device of claim 4, further including:
an input/output (I/O) switch fabric coupled between the analog blocks and the external connections and configurable to provide signal paths between the external connections and the analog blocks in response to configuration information.

9. An integrated circuit device, comprising:
a plurality of programmable digital blocks;
a plurality of analog blocks, each comprising at least one analog circuit, and at least one analog block being a programmable analog block;
at least one processor section coupled to at least one programmable digital block, the processor section formed in the same substrate as the analog blocks and programmable digital blocks; and
a plurality of external connections, wherein the programmable analog block includes a programmable switch section configurable to enable any of a plurality of signal paths to at least the external connections in response to inputs from at least one programmable digital block.

10. A method, comprising:

enabling signal paths between at least one analog block and external connections of an integrated circuit device by controlling a programmable analog routing within the analog block with at least one of a plurality of programmable digital blocks; and processing output results from at least one of the analog blocks independent of a processing element formed in the same substrate of the integrated circuit device, wherein the at least one analog block is one of a plurality of analog blocks that each includes at least one analog circuit, and the analog blocks and programmable digital blocks are formed in the same substrate of the integrated circuit device.

11. The method of claim 10, further including:

according to first configuration data, enabling the signal paths with at least one of the programmable digital blocks, and according to second configuration data, enabling the signal paths with a sequencer circuit within the one analog block.

12. The method of claim 10, further including:

altering operations of the one analog block in response to output data from the one analog block.

13. The method of claim 10, further including:

altering functions of the one analog block in response to configuration data.

14. An integrated circuit device, comprising:

a plurality of analog blocks, including a plurality of programmable analog blocks configurable to provide different analog functions in response to configuration data, at least one programmable analog block including a programmable analog routing coupled to a plurality of external connections to the integrated circuit device; and a plurality of programmable digital blocks, at least one programmable digital block configurable into an analog block control circuit that configures the programmable analog routing, wherein the analog block control circuit is configured to provide static control of the programmable analog routing.

15. The integrated circuit device of claim 14, further including:

at least one processor circuit coupled to at least one programmable digital block, the processor element formed in the same substrate as the analog blocks and programmable digital blocks.

16. The integrated circuit device of claim 15, wherein:

the analog block control circuit is configured to control at least the analog routing independently of the processor circuit.

17. The integrated circuit of claim 14, wherein:

the analog block control circuit is further configured to control analog circuit functions of the at least one programmable analog block.

18. The integrated circuit device of claim 14, wherein:

the programmable analog block includes an analog circuit selected from the group of: data converters, including analog-to-digital converters (ADCs) and digital-to-analog converters (DACs), comparators, operational amplifiers, analog reference circuits, capacitance sensing circuits, display driving circuits, charge pump circuits, analog filters, and temperature sensing circuits.

19. An integrated circuit device, comprising:

a plurality of analog blocks, including a plurality of programmable analog blocks configurable to provide different analog functions in response to configuration data, at least one programmable analog block including a programmable analog routing coupled to a plurality of external connections to the integrated circuit device; and a plurality of programmable digital blocks, at least one programmable digital block configurable into an analog block control circuit that configures the programmable analog routing, wherein the analog block control circuit is configured to provide dynamic control of the programmable analog routing.

20. The integrated circuit device of claim 19, further including:

at least one processor circuit coupled to at least one programmable digital block, the processor element formed in the same substrate as the analog blocks and programmable digital blocks.

21. The integrated circuit device of claim 20, wherein:

the analog block control circuit is configured to control at least the analog routing independently of the processor circuit.

22. The integrated circuit of claim 19, wherein:

the analog block control circuit is further configured to control analog circuit functions of the at least one programmable analog block.

23. The integrated circuit device of claim 19, wherein:

the programmable analog block includes an analog circuit selected from the group of: data converters, including analog-to-digital converters (ADCs) and digital-to-analog converters (DACs), comparators, operational amplifiers, analog reference circuits, capacitance sensing circuits, display driving circuits, charge pump circuits, analog filters, and temperature sensing circuits.

24. The integrated circuit device of claim 9, wherein:

at least one of the programmable digital block is configurable to control operations of the programmable analog block independently of the processor section.

25. The integrated circuit device of claim 9, wherein:

at least one of the analog blocks includes an analog circuit selected from the group of: data converters, including analog-to-digital converters (ADCs) and digital-to-analog converters (DACs), comparators, operational amplifiers, analog reference circuits, capacitance sensing circuits, display driving circuits, charge pump circuits, analog filters, and temperature sensing circuits.

26. The integrated circuit device of claim 9, wherein:

the at least one programmable analog block is further configurable to provide different analog functions in response to configuration data.

27. The integrated circuit device of claim 9, wherein:

at least one of the digital blocks is configurable to process data from at least one analog block.

28. The integrated circuit device of claim 9, further including:

an input/output (I/O) switch fabric coupled between the analog blocks and the external connections and configurable to provide signal paths between the external connections and the analog blocks in response to configuration information.

* * * * *